(12) United States Patent
Kim et al.

(10) Patent No.: US 10,921,858 B2
(45) Date of Patent: *Feb. 16, 2021

(54) CASE INCLUDING METAL FOR AN ELECTRONIC DEVICE AND ELECTRONIC DEVICE HAVING THE SAME

(71) Applicant: Samsung Electronics Co., Ltd., Gyeonggi-do (KR)

(72) Inventors: Yeonwoo Kim, Seoul (KR); Hosaeng Kim, Gyeonggi-do (KR); Hoon Park, Seoul (KR); Jinwoo Jung, Seoul (KR)

(73) Assignee: Samsung Electronics Co., Ltd

( * ) Notice: Subject to any disclaimer, the term of this patent is extended or adjusted under 35 U.S.C. 154(b) by 474 days.

This patent is subject to a terminal disclaimer.

(21) Appl. No.: 15/239,419

(22) Filed: Aug. 17, 2016

(65) Prior Publication Data
US 2016/0357223 A1    Dec. 8, 2016

Related U.S. Application Data

(63) Continuation of application No. 14/528,564, filed on Oct. 30, 2014, now Pat. No. 9,442,515.

(30) Foreign Application Priority Data

Oct. 30, 2013    (KR) .................. 10-2013-0130179

(51) Int. Cl.
*G06F 1/16*    (2006.01)
*H05K 5/04*    (2006.01)
(Continued)

(52) U.S. Cl.
CPC ............ *G06F 1/1656* (2013.01); *G06F 1/169* (2013.01); *G06F 1/1613* (2013.01);
(Continued)

(58) Field of Classification Search
CPC .... H05K 7/20418; H05K 9/0007; H05K 5/04; H05K 5/0004; G06F 1/1613;
(Continued)

(56) References Cited

U.S. PATENT DOCUMENTS 7,983,030 B2 *   7/2011   Takayanagi ........... G06F 1/1616
                                                         349/58
9,059,505 B1 *   6/2015   Asrani ................... H01Q 9/145
(Continued)

FOREIGN PATENT DOCUMENTS

CN    104584324    4/2015
EP    3 139 438    3/2017
(Continued)

OTHER PUBLICATIONS

Korean Office Action dated Sep. 11, 2019 issued in counterpart application No. 10-2013-0130179, 12 pages.

*Primary Examiner* — Anthony M Haughton
(74) *Attorney, Agent, or Firm* — The Farrell Law Firm, P.C.

(57) ABSTRACT

An apparatus is provided. The apparatus includes a case forming at least one portion of a surface of the apparatus, the at least one portion of the surface including a first metal portion, a second metal portion, and a non-metal portion disposed between the first and second metal portions; and a touchscreen display at least partially housed in the case.

16 Claims, 9 Drawing Sheets

(51) Int. Cl.
*H01Q 1/24* (2006.01)
*H05K 5/00* (2006.01)
*H01Q 1/44* (2006.01)
*H04M 1/02* (2006.01)
*H04B 1/3888* (2015.01)

(52) U.S. Cl.
CPC .......... *G06F 1/1643* (2013.01); *G06F 1/1698* (2013.01); *H01Q 1/24* (2013.01); *H01Q 1/243* (2013.01); *H01Q 1/44* (2013.01); *H05K 5/0004* (2013.01); *H05K 5/04* (2013.01); *H04B 1/3888* (2013.01); *H04M 1/0202* (2013.01)

(58) Field of Classification Search
CPC ...... G06F 1/1656; G06F 1/169; G06F 1/1698; G06F 1/1626; G06F 1/1632; G06F 2200/1632; G06F 2200/1633; G06F 1/1601; G06F 1/1633; G06F 1/1643; G06F 1/643; H01Q 1/243; H01Q 1/44; H01Q 1/24; H04M 1/0202; H04B 1/3888
USPC ............ 361/679.56, 679.55, 679.02, 679.21, 361/679.22, 679.26, 679.27
See application file for complete search history.

(56) References Cited

U.S. PATENT DOCUMENTS

| | | | |
|---|---|---|---|
| 2007/0008227 A1* | 1/2007 | Napoles | H01Q 1/243 343/702 |
| 2007/0216583 A1 | 9/2007 | Hou | |
| 2009/0179751 A1* | 7/2009 | Forster | G06K 19/0717 340/501 |
| 2012/0218723 A1 | 8/2012 | Kwak et al. | |
| 2013/0108813 A1 | 5/2013 | Zhu | |
| 2013/0234910 A1* | 9/2013 | Oh | H01Q 1/243 343/872 |
| 2013/0257662 A1 | 10/2013 | Eom | |

FOREIGN PATENT DOCUMENTS

| | | |
|---|---|---|
| JP | 2013-94667 | 5/2013 |
| KR | 1020110083966 | 7/2011 |
| KR | 1020120097877 | 9/2012 |
| KR | 1020120138019 | 12/2012 |

\* cited by examiner

CASE INCLUDING METAL FOR AN ELECTRONIC DEVICE AND ELECTRONIC DEVICE HAVING THE SAME

PRIORITY

This application is a Continuation of U.S. application Ser. No. 14/528,564 filed in the U.S. Patent and Trademark Office on Oct. 30, 2014, which claims priority under 35 U.S.C. § 119(a) to Korean Patent Application No. 10-2013-0130179, which was filed in the Korean Intellectual Property Office on Oct. 30, 2013, the entire content of each of which is incorporated herein by reference.

BACKGROUND OF THE INVENTION

1. Field of the Invention

The present invention relates generally to a case including metal for an electronic device and an electronic device having the same.

2. Description of the Prior Art

With the development of information communication technology and semiconductor technology, the use of electronic devices is rapidly increasing. The electronic devices developed recently are not limited to their traditional unique areas but are combined with various terminals. For example, a mobile communication terminal provides various functions such as a TV function (for example, mobile broadcasting such as Digital Multimedia Broadcasting (DMB) or Digital Video Broadcasting (DVB)), a music reproduction function (for example, MPEG Audio Layer-3 (MP3)), a picture or video photographing function, an Internet connection function, and a radio reception function, in addition to communication functions such as voice communication and the transmission/reception of messages.

The general trend is for electronic devices to be slim, and as such the slim electronic devices have a metal case for improved strength or for design. Further, the electronic devices include at least one antenna to provide various wireless communication functions.

However, when a metal case surrounds an antenna, performance of the antenna is often significantly decreased. Accordingly, in conventional electronic devices, it is common that metal at a portion where the antenna is located is removed from the metal case.

Further, in conventional electronic devices, the metal case is often separated (cut), and the separated area is utilized as a portion for the antenna. Consequently the cut portion of the electronic device is exposed to the outside, and as such, the performance of the antenna is often badly influenced by the human body. The location, size, and shape of the cut portion may be different according to a frequency band supported by electronic devices.

SUMMARY OF THE INVENTION

The present invention has been made in an effort to solve at least one of the above-described problems and/or disadvantages, and to provide at least the advantages described below.

Accordingly, an aspect of the present invention is to provide a case for an electronic device including metal, wherein only an uncut portion of the metal is exposed to the outside and a cut portion of the metal is not exposed to the outside, and an electronic device having the same.

Another aspect of the present invention is to provide a case for an electronic device including metal, wherein a cut portion of metal is not exposed to the outside, thereby reducing an influence of a human body on the metal, and an electronic device having the same.

Another aspect of the present invention is to provide a case for an electronic device including metal, wherein a cut portion of metal is not exposed to the outside, thereby reducing an influence of the cut portion on the design, and an electronic device having the same.

Another aspect of the present invention is to provide a case for an electronic device including a divided metal, part that can be utilized as a configuration of an antenna, a function key, a wireless charger or a grip sensor, and an electronic device having the same.

In accordance with an aspect of the present invention, apparatus is provided The apparatus includes a case forming at least one portion of a surface of the apparatus, the at least one portion of the surface including a first metal portion, a second metal portion, and a non-metal portion disposed between the first and second metal portions; and a touchscreen display at least partially housed in the case.

In accordance with another aspect of the present invention, an apparatus is provided. The apparatus includes a case forming at least one portion of a surface of the apparatus, the at least one portion of the surface including a first metal portion, a second metal portion, and a non-metal portion disposed between the first and second metal portions, the first and second metal portions separated from each other at a first location below the non-metal portion, and the first and second metal portions connected to each other at a second location below the non-metal portion; and a touchscreen display at least partially housed in the case.

In accordance with another aspect of the present invention, an apparatus is provided. The apparatus includes a case forming at least one portion of a surface of the apparatus, the at least one portion of the surface including a first metal portion, a second metal portion, and a non-metal portion disposed between the first and second metal portions, the first metal portion or the second metal portion to be used for a specified function of the apparatus; and a touchscreen display at least partially housed in the case.

BRIEF DESCRIPTION OF THE DRAWINGS

The above and other aspects, features, and advantages of certain embodiments of the present invention will be more apparent from the following detailed description, taken in conjunction with the accompanying drawings, in which.

DETAILED DESCRIPTION OF EMBODIMENTS OF THE PRESENT INVENTION

Figure 1:
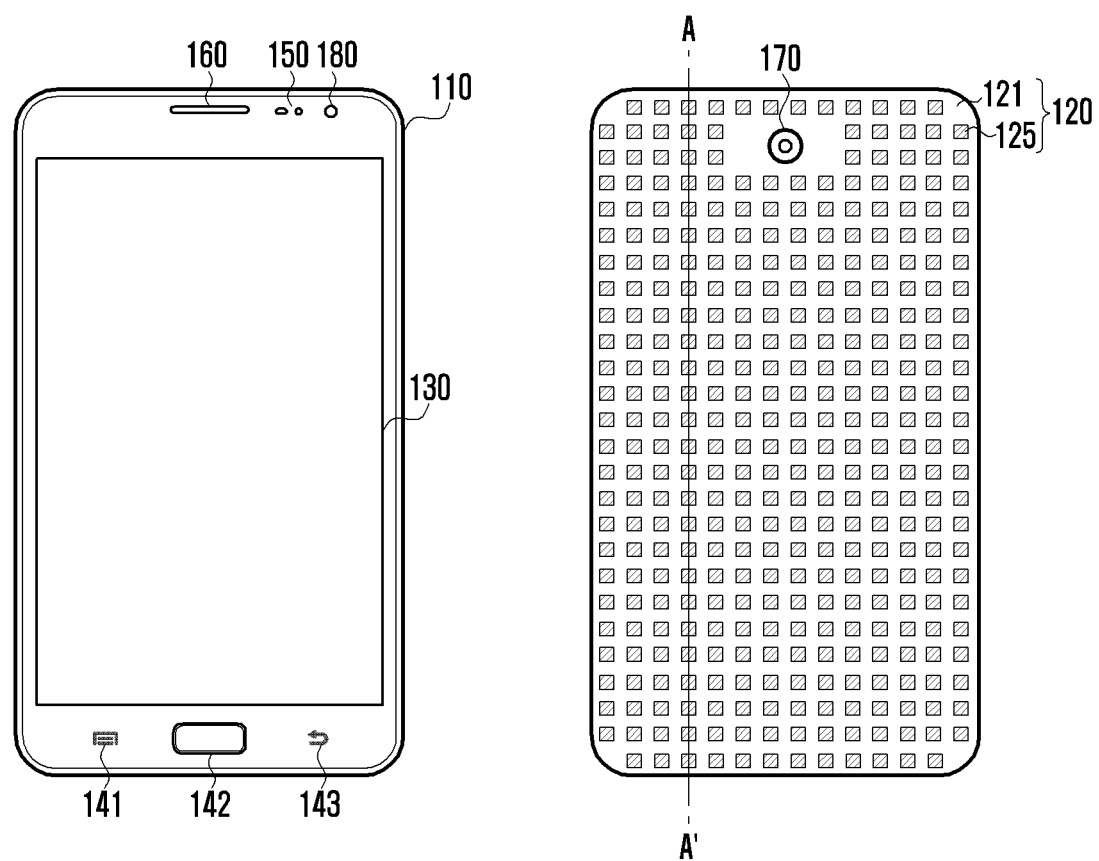
FIG. 1 illustrates an electronic device according to an embodiment of the present invention.

Hereinafter, various embodiments of the invention will be described in detail with reference to the accompanying drawings. It should be noted that the same elements will be designated by the same reference numerals although they are shown in different drawings. Further, detailed descriptions related to well-known functions or configurations capable of making subject matters of the present invention unnecessarily obscure will be omitted.

In the following description, it should be noted that only portions required for comprehension of operations according to the embodiments of the present invention will be described and descriptions of other portions will be omitted not to make subject matters of the present invention obscure. Also, in the accompanying drawings, some elements are exaggerated, omitted, or schematically illustrated, and the size of each element does not entirely reflect an actual size.

The various embodiments of the present invention described herein and in the drawings have been presented to easily explain contents of the present invention and help comprehension of the present invention, and do not limit the scope of the present invention. Therefore, it should be construed that all modifications or modified forms drawn by the technical idea of the present invention in addition to the embodiments disclosed herein are included in the scope of the present invention. An electronic device according to an embodiment of the present invention may include a mobile communication device, a Personal Digital Assistant (PDA), a smartphone, a tablet Personal Computer (PC), a Portable Multimedia Player (PMP), a wearable device, and the like.

Figure 2A:
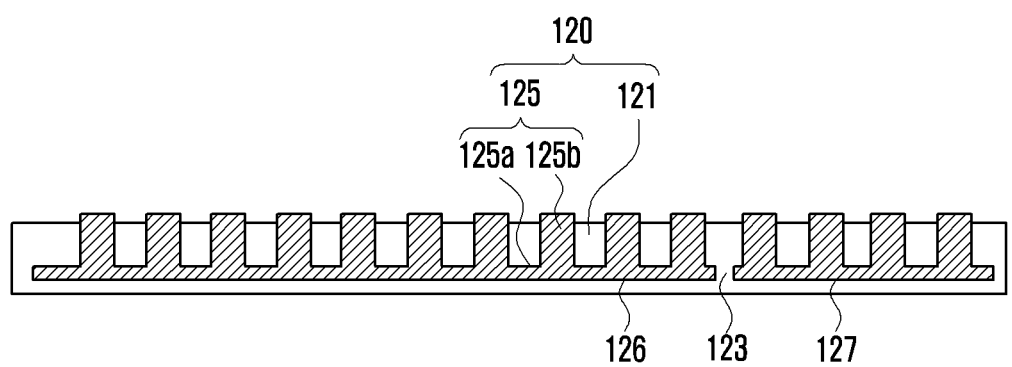
FIGS. 2A and 2B are sectional views illustrating a case of an electronic device according to the embodiment of the present invention, the sectional views being taken along line A-A' of FIG. 1.
Figure 2B:
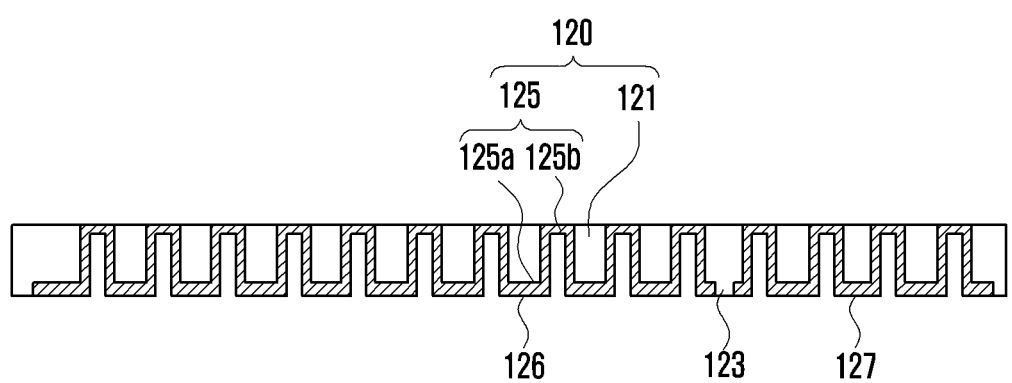

FIG. 1 illustrates an electronic device according to an embodiment of the present invention. FIGS. 2A and 2B are sectional views illustrating a case of an electronic device according to an embodiment of the present invention, the sectional views being taken along line A-A' of FIG. 1.

Referring to FIGS. 1 and 2B, an electronic device 100 includes a processor 101, a touch panel 102, a display unit 130 located on a front surface of the electronic device 100, an illumination sensor 150, a speaker 160, a front camera 180 located at a upper end of the display unit 130, a plurality of keys 141, 142, and 143 located at lower end of the display unit 130, and a rear camera 170 located on a rear surface of the electronic device 100.

The electronic device 100 includes a front case portion 110 and a rear case portion 120. The rear case portion 120 includes an injection-molding part 121 and a metal part 125. The injection-molding part 121 may be formed of a non-metallic plastic.

The metal part 125 is located under the injection-molding part 121, and is partially exposed to the outside through a hole of the injection-molding part 121. That is, the metal part 125 includes an area 125a (hereinafter, referred to as a plate portion) which is not exposed to the outside, and an area 125b (hereinafter, referred to as a protruding portion) which is exposed to the outside. As illustrated in FIG. 2A, the metal part 125 is formed in a convexo-concave pattern. As illustrated in FIG. 2B, the metal part 125 is formed in a meandering pattern. Further, the metal part 125 may be formed in a combination type of a convexo-concave type and a meandering type.

The metal part 125 is divided into a plurality of parts or has at least one slit. As indicated by reference numeral 123 of FIGS. 2A and 2B, a portion of the plate portion 125a of the metal part 125 which is not exposed to the outside, is cut (herein after, referred to as "slit 123"), and the metal part 125 may be divided into a plurality of parts 126, 127, wherein the plurality of divided metal parts are provided on opposite sides of the slit 123.

At least one of the plurality of divided metal parts and/or the slit may be utilized as a component element related to a specific function of the electronic device 100. For example, at least one of the divided metal parts may be utilized as an antenna. The antenna may include a mobile communication antenna for mobile communication such as 2G, 3G, or 4G, a Bluetooth antenna for Bluetooth communication, a Near Field Communication (NFC) antenna, a wireless LAN antenna, a wireless charging antenna, a diversity antenna, and a grip sensor antenna. The antenna may be a coupling antenna, a (Planar) Inverted-F Antenna ((P)IFA), a loop antenna, a patch antenna, etc.

Further, the divided metal parts may be utilized as function keys (for example, a power key and volume keys). When being utilized as function keys, the divided metal parts are connected to a sensor for detecting a touch.

In addition, the divided metal parts (or slits) may be utilized as a configuration (for example, a coil or a pattern) for NFC or wireless charging.

The electronic device 100 illustrated in FIG. 1 is a simple example, the embodiments of the present invention are not limited thereto. For example, although a bar type electronic device is illustrated in FIG. 1, the embodiments of the present invention may be applied to a folder type electronic device or a slide type electronic device. Further, FIG. 1 illustrates the present invention being applied to the rear case portion 120 of the electronic device 100, it may be applied to a front case portion 110 and/or a side case portion of the electronic device 100.

Figure 3:
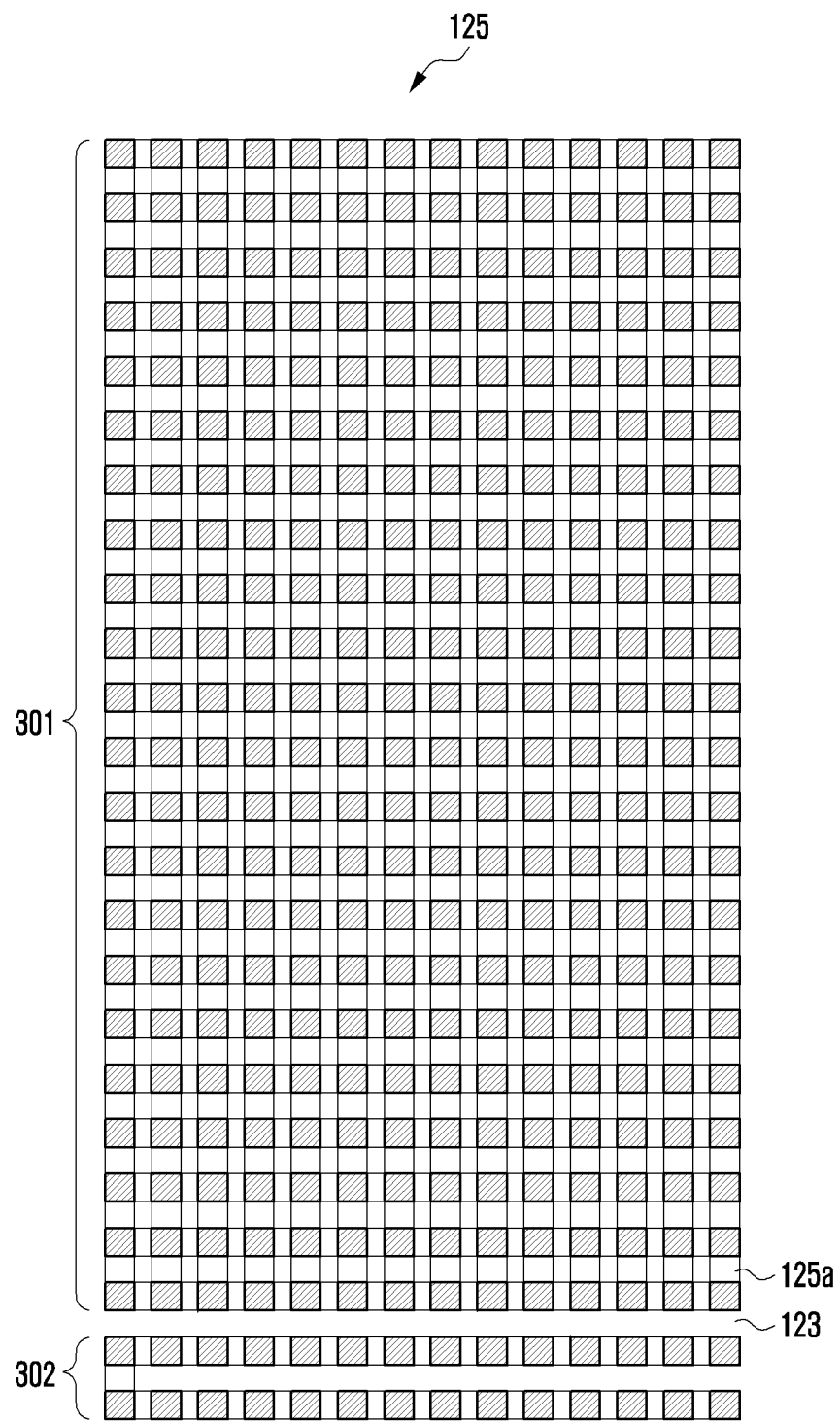
FIGS. 3 and 4 illustrate a method of forming an antenna using a metal part of a case according to an embodiment of the present invention.
Figure 4:
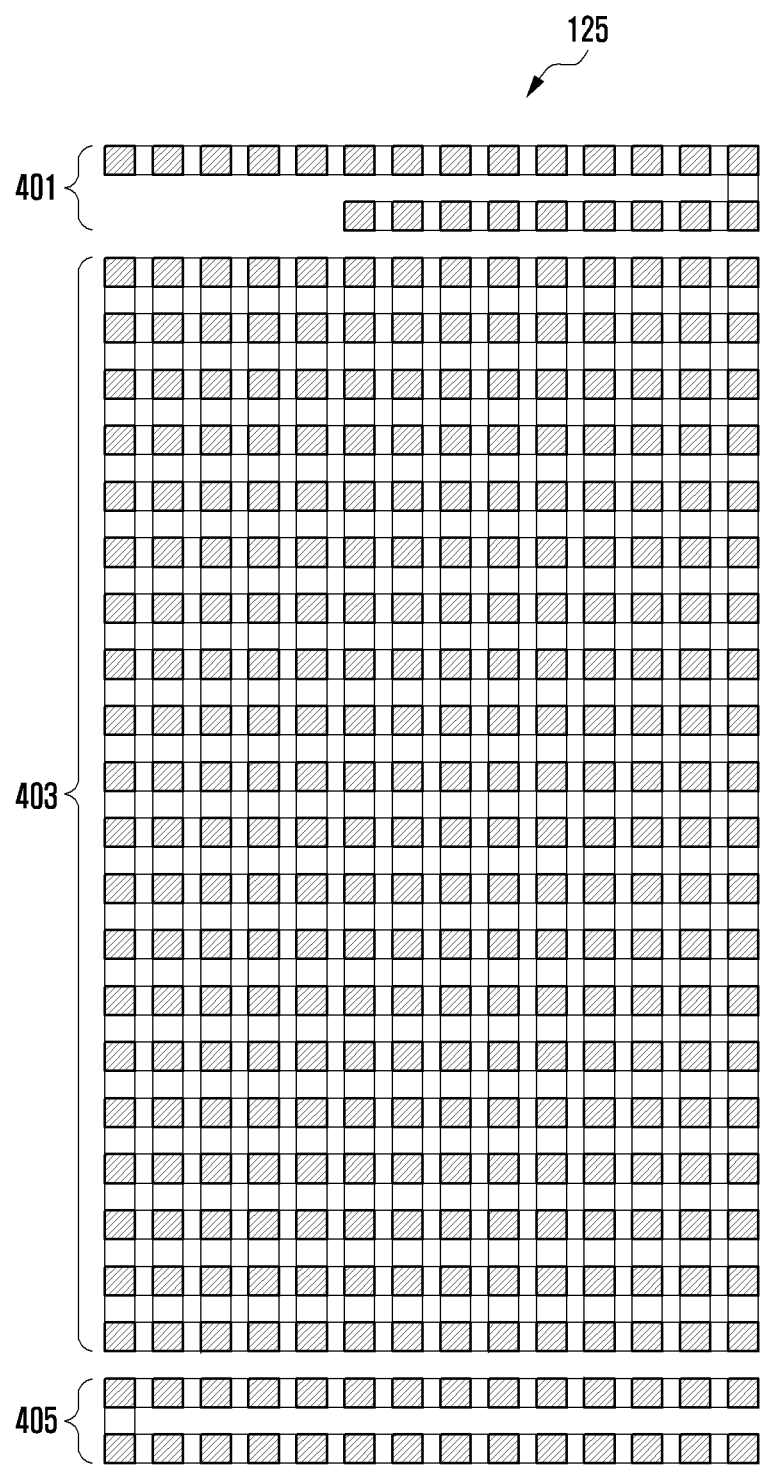

FIGS. 3 and 4 illustrate a method of forming an antenna using a metal part of a case according to an embodiment of the present invention.

In FIGS. 3 and 4, a portion having a shadow refers to a protruding portion and a portion having no shadow refers to a plate portion.

Referring to FIG. 3, the metal part 125 may be classified into a first area 301 and a second area 302 as the plate portion 125a is partially removed at slit 123. For example, the first area 301 is an area in which a strength and/or a design of the case is considered. Further, a printed circuit board (PCB), on which the processor 101 is mounted, may be disposed in the electronic device 100. The first area 301 may be electrically connected to a ground area of the PCB of the electronic device 100 and may be utilized to expand the ground.

The second area 302 may be an antenna of the electronic device 100. The second area 302 performing an antenna function may be electrically connected to a power feeding unit of the printed circuit board. The second area 302 may be electrically connected to the power feeding unit and the ground of the printed circuit board. Although FIG. 3 illustrates that the second area 302 has a stapler shape, it is not limited thereto. For example, the second area 302 may have a different shape and/or size according to a frequency band supported by the electronic device. Referring to FIG. 4, the metal part 125 is divided into a first area 401, a second area 403, and a third area 405. The first area 401 and the third area 405 may be utilized as antennas. Similarly, when the electronic device 100 requires a plurality of antennas, the metal part 125 may be divided into more than 3 parts.

In the above-described embodiments of the present invention, the metal part 125 is divided into a plurality of parts by partially removing the plate portion 125a, which is not exposed to the outside. Accordingly, the slit 123 of the metal part 125 is not exposed to the outside. Accordingly, when the electronic device 100 supports different frequency band using different antennas, an external design of the electronic device 100 may be the same. Further, reduction of antenna performance due to a human body can be prevented.

Figure 5:
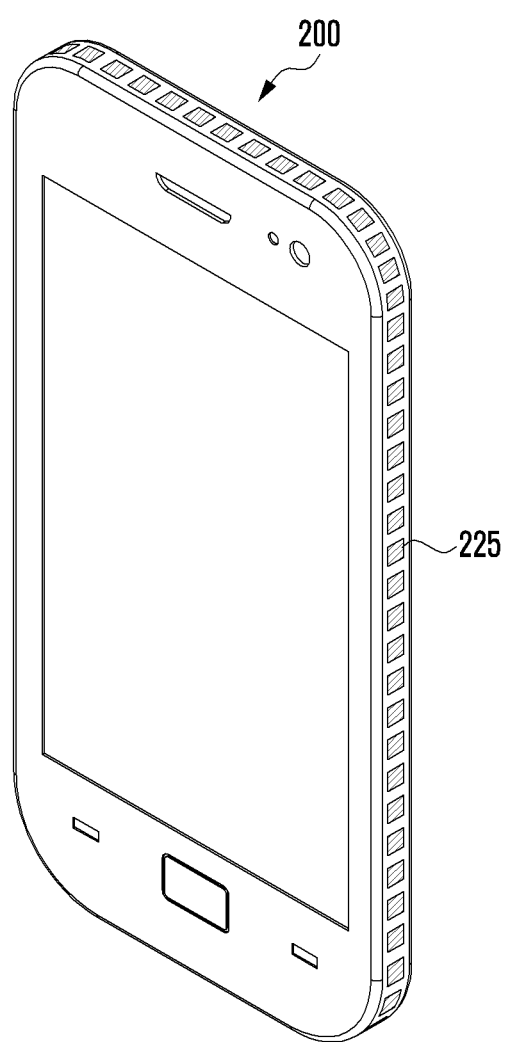
FIG. 5 illustrates an electronic device according to an embodiment of the present invention.
Figure 6:
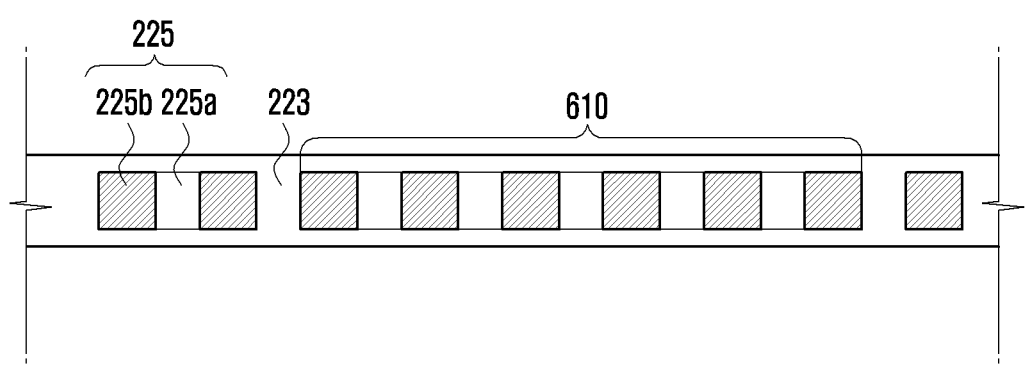
FIG. 6 illustrates a method of forming an antenna of an electronic device according to an embodiment of the present invention.

FIG. 5 illustrates an electronic device according to an embodiment of the present invention. FIG. 6 illustrates a method of forming an antenna of an electronic device according to an embodiment of the present invention.

Referring to FIGS. 5 and 6, the electronic device 200 includes a metal part 225 on a side surface of a case. The metal part 225 is exposed to the outside only partially. For example, the metal part 225 includes a plate portion 225a which is not exposed to the outside and a protruding portion 225b, which is exposed to the outside. This structure has already been described above, and, therefore, a repetitive description is omitted here.

As illustrated in FIG. 6, the metal part 225 is divided into a plurality of parts by partially removing the plate portion 225a at a slit 223. A specific metal part portion 610 of the divided metal part portions may be utilized as a component element related to a specific function of the electronic device 200. For example, the divided specific metal part portion 610 is utilized as an antenna, a function key (for example, a volume key or a power key), or a grip sensor. Here, the grip sensor recognizes the gripping of an antenna portion by the user. When the gripping of an antenna portion by the user is recognized by the grip sensor, the electronic device 200 controls to use an antenna at another location so that the antenna and the grip sensor can be commonly used.

Figure 7:
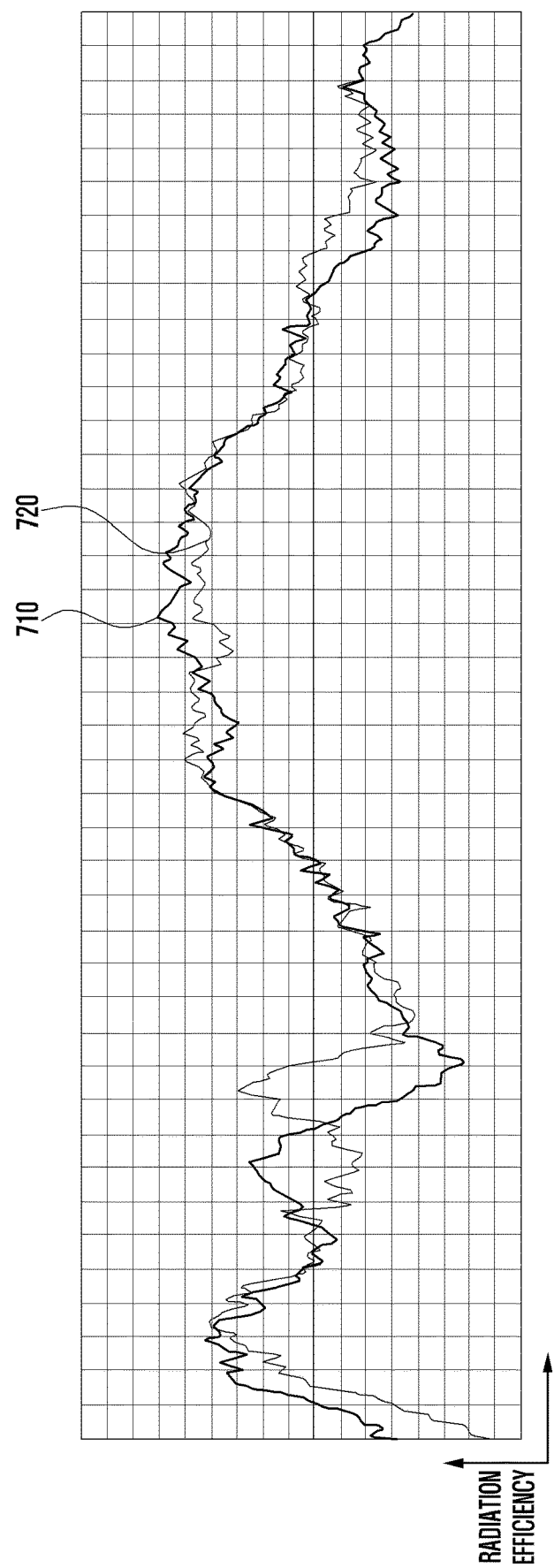
FIG. 7 is a graph illustrating measuring antenna efficiency of a conventional electronic device having a metal case having an exposed external cut portion and of an electronic device according to an embodiment of the present invention.

FIG. 7 illustrates a graph obtained by measuring antenna efficiency of a conventional electronic device having a metal case having an exposed external slit and of an electronic device according to an embodiment of the present invention.

Referring to FIG. 7, a first graph 710 illustrates measured radiation efficiency of a conventional electronic device having a metal case having an externally exposed slit according to the related art. A second graph 720 illustrates radiation efficiency of an electronic device of which a slit is not exposed to the outside according to an embodiment of the present invention. As can be seen, the radiation efficiency of the antenna of the electronic device according to the embodiment of the present invention is equivalent (similar) to the radiation efficiency of the antenna of the electronic device according to the related art.

However, because a slit of the electronic device according to the related art is exposed to the outside, performance of an antenna is significantly decreased by a contact of a human body. On the other hand, because a slit according to the embodiment of the present invention is not exposed to the outside, a decrease in performance of an antenna due to human contact is prevented.

Figure 8:
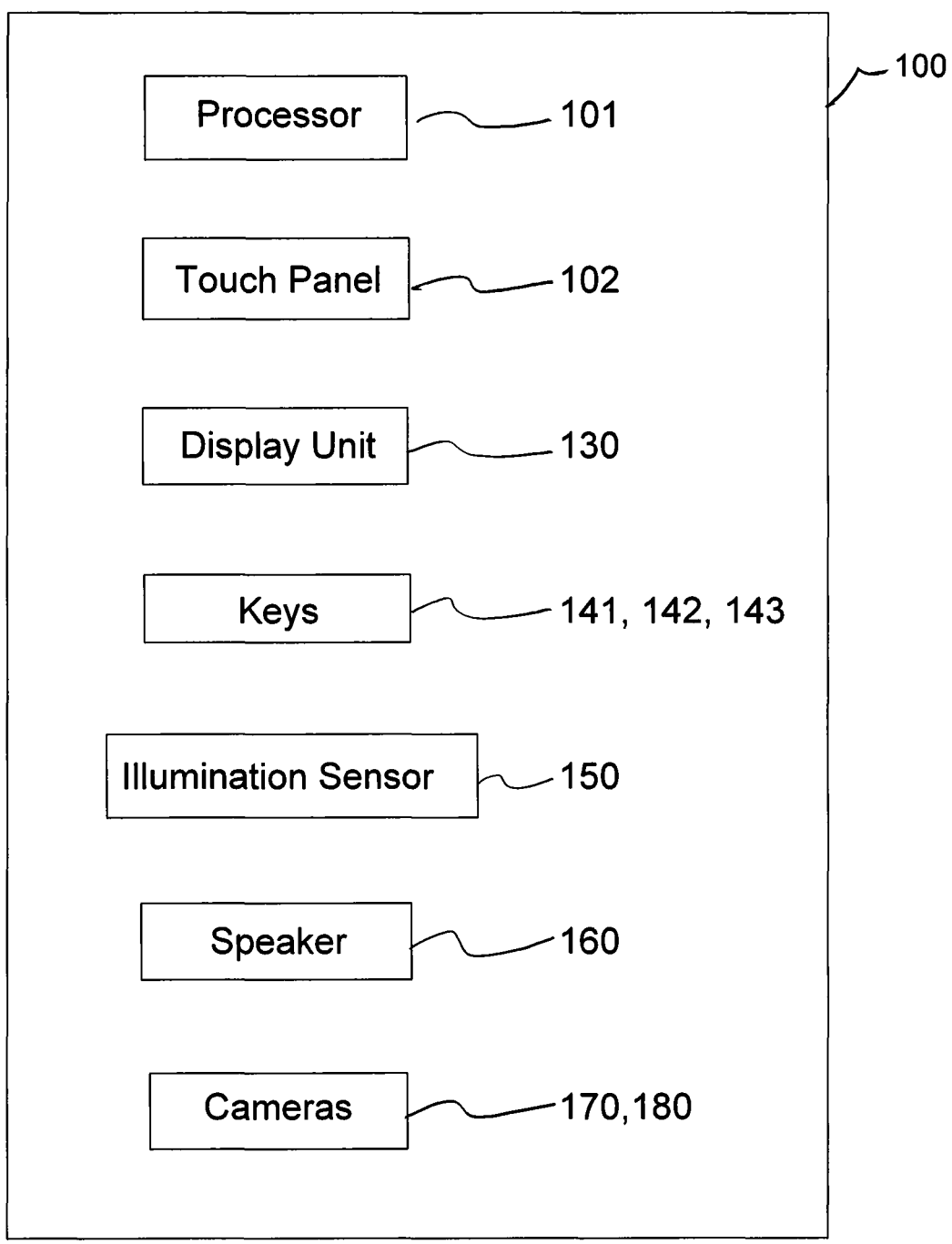
FIG. 8 is a block diagram of an electronic device, according to an embodiment of the present invention.

FIG. 8 is a block diagram of an electronic device, according to an embodiment of the present invention.

Referring to FIG. 8, the electronic device 100 is provided. The electronic device 100 includes the processor 101, the touch panel 102, the display unit 130, the plurality of keys 141, 142, and 143, the illumination sensor 150, the speaker 160, and the rear and front cameras 170 and 180. The touch panel 102 and the display unit 130 may be implemented as a single module to form a touchscreen.

As described above, in the embodiments of the present invention, because the slit of the metal is not exposed to the outside, the user cannot recognize a location of the antenna. Further, because a slit according to the embodiment of the present invention is not exposed to the outside, a decrease in performance of an antenna due to a human body can be prevented. In addition, because the slit is not exposed to the outside, an antenna can be freely designed without being influenced by the design of the electronic device. In addition, the divided metals may be utilized as a configuration of a function key, a grip sensor, NFC, or wireless charging.

Although the case including a metal and the electronic device including the same according to embodiments of the present invention have been described through the present specification and accompanying drawings by using the specific terms, the terms are merely used as general meanings to easily describe various embodiments of the present invention and assist understanding of the present invention, and the present invention is not limited to the above embodiments. That is, it is obvious to those skilled in the art to which the present invention belongs that various embodiments can be implemented based on the technical idea of the present invention. It will be understood by those skilled in the art that various changes and modifications may be made without departing from the spirit and scope of the invention as defined in the following claims and their equivalents.

What is claimed is:

1. An apparatus comprising:
   a case forming at least one portion of a surface of the apparatus, at least one portion of the case including a metal portion and a non-metal portion; and
   a touchscreen display at least partially housed in the case,
   wherein the metal portion comprises a first metal portion and a second metal portion,
   wherein the non-metal portion is disposed between the first metal portion and the second metal portion,
   wherein the metal portion comprises a slit filled with the non-metallic portion that contacts respective sides of each of the first metal portion and the second metal portion,
   wherein the first metal portion is configured to be used with respect to an antenna function of the apparatus, and
   wherein the second metal portion is configured to be used as a sensor or an input function of the apparatus.

2. The apparatus of claim 1, wherein the first and second metal portions are separated from each other below the non-metal portion.

3. The apparatus of claim 1, wherein the case comprises a first opening and a second opening formed therein, and
   wherein the first metal portion is disposed via the first opening, and the second metal portion is disposed via the second opening.

4. The apparatus of claim 1, further comprising a processor mounted on a printed circuit board (PCB),
   wherein at least one of the first metal portion and the second metal portion is electrically coupled with the PCB.

5. The apparatus of claim 4, wherein a corresponding metal portion of the at least one of the first metal portion and the second metal portion electrically connected with the PCB is to be used with respect to a specified function of the apparatus.

6. An apparatus comprising:
   a case forming at least one portion of a surface of the apparatus, at least one portion of the case including a first metal portion, a second metal portion, and a non-metal portion disposed between the first and second metal portions, the first and second metal portions separated from each other, and the first and second metal portions connected to each other at a second location below the non-metal portion; and a touchscreen display at least partially housed in the case, wherein the metal portion comprises a slit filled with the non-metallic portion that contacts respective sides of each of the first metal portion and the second metal portion.

7. The apparatus of claim 6, wherein the non-metal portion comprises a plastic.

8. The apparatus of claim 6, wherein the non-metal portion is in contact with two sides of each of the first metal portion and the second metal portion.

9. The apparatus of claim 6, wherein the case comprises a first opening and a second opening formed therein, and wherein the first metal portion is disposed via the first opening, and the second metal portion is disposed via the second opening.

10. The apparatus of claim 6, further comprising a processor mounted on a printed circuit board (PCB),
wherein at least one of the first metal portion and the second metal portion is electrically coupled with the PCB.

11. The apparatus of claim 10, wherein a corresponding metal portion of the at least one of the first metal portion and the second metal portion electrically connected with the PCB is to be used with respect to a specified function of the apparatus.

12. The apparatus of claim 10, wherein a corresponding metal portion of the at least one of the first metal portion and the second metal portion electrically connected with the PCB is to be used with respect to an antenna function.

13. An apparatus comprising:

a case forming at least one portion of a surface of the apparatus, at least one portion of the case including a first metal portion, a second metal portion, and a non-metal portion disposed between the first and second metal portions, the first metal portion or the second metal portion to be used for a specified function of the apparatus; and a touchscreen display at least partially housed in the case, wherein the non-metal portion comprises a slit filled with the non-metallic portion that contacts respective sides of each of the first metal portion and the second metal portion, wherein the first metal portion is to be used with respect to an antenna function of the apparatus and the second metal portion is to be used with respect to a sensor or an input function of the apparatus.

14. The apparatus of claim 13, further comprising a processor mounted on a printed circuit board (PCB),
wherein at least one of the first metal portion and the second metal portion is electrically coupled with the PCB.

15. The apparatus of claim 14, wherein the processor is adapted to:
radiate or receive a signal corresponding to the specified function using the first metal portion.

16. The apparatus of claim 14, wherein the processor is adapted to:
use the second metal portion as the sensor.

* * * * *